United States Patent [19]
Tamamura et al.

[11] Patent Number: 5,579,236
[45] Date of Patent: Nov. 26, 1996

[54] VOLTAGE/CURRENT MEASURING UNIT AND METHOD

[75] Inventors: Toshio Tamamura, Hachioji; Shinichi Tanida, Kawasaki, both of Japan

[73] Assignee: Hewlett-Packard Company, Palo Alto, Calif.

[21] Appl. No.: 634,755

[22] Filed: Apr. 11, 1996

Related U.S. Application Data

[63] Continuation of Ser. No. 195,383, Feb. 14, 1994, abandoned.

[30] Foreign Application Priority Data

Feb. 27, 1993 [JP] Japan .................................. 5-063389

[51] Int. Cl.$^6$ ............................................. G01R 19/145
[52] U.S. Cl. ........................ 364/483; 364/481; 364/487; 371/22.1
[58] Field of Search .................................... 364/481, 483, 364/485–487; 324/99 D; 371/27, 22.1, 25.1; 341/141, 110, 122, 165, 109, 120, 153–155, 94, 144

[56] References Cited

U.S. PATENT DOCUMENTS

| | | | |
|---|---|---|---|
| 4,637,020 | 1/1987 | Schinabeck | 371/25.1 |
| 4,646,299 | 2/1987 | Schinabeck et al. | 371/25.1 |
| 5,146,224 | 9/1992 | Kitayoshi | 341/144 |
| 5,243,344 | 9/1993 | Koulopoulos et al. | 341/143 |
| 5,298,859 | 3/1994 | McEachern et al. | 364/483 |
| 5,298,898 | 3/1994 | Brunheim | 341/144 |
| 5,301,072 | 4/1994 | Wilson | 360/77.01 |
| 5,325,051 | 6/1994 | Germer et al. | 364/483 |

OTHER PUBLICATIONS

Hewlett Packard Operation and Service Manual "Model 4145A—Semiconductor Parameter Analyzer" Yokogawa–Hewlett–Packard, Ltd. 1982, pp. 8–104–8–112.
"Intelligent Instrument Streamlines dc Semiconductor Parameter Measurements", K. Maeda, et al., Hewlett–Packard Journal, Oct. 1982, pp. 3–20.

Primary Examiner—Emanuel T. Voeltz
Assistant Examiner—Hal D. Wachsman

[57] ABSTRACT

A voltage/current measuring unit includes a signal generating source having a digital error detecting unit and a digital-to-analog converter (DAC) connected in series, a current measuring resistor having first and second terminals respectively connected to an output terminal of the signal generating source and a connection terminal, a voltage measuring circuit connected to the digital error detecting unit for measuring a voltage at said second terminal of the current measuring resistor and for providing a voltage feedback signal to the signal generating source, a current measuring circuit connected to the digital error detecting unit for measuring a voltage across the first and second terminals of the current measuring resistor, and for providing a current feedback signal to said signal generating source, the voltage measuring circuit and current measuring circuit both include analog-to-digital converters for respectively converting a voltage appearing at the second terminal of the current measuring resistor and a voltage appearing across the first and second terminals of the current measuring resistor into digital voltage values that are fed to the signal generating source.

7 Claims, 6 Drawing Sheets

VOLTAGE/CURRENT MEASURING UNIT AND METHOD

This is a continuation of application Ser. No. 08/195,383 filed on Feb. 14 1994 now abandoned.

FIELD OF THE INVENTION

The present invention relates to a voltage/current measuring apparatus and method employed in electronic measuring apparatuses such as semiconductor measuring apparatus, and more specifically, to such a voltage/current measuring apparatus/method that is capable of measuring various electric characteristics of a device under test (DUT).

BACKGROUND OF THE INVENTION

FIG. 6 is a schematic block diagram showing a prior art voltage/current characteristic measuring unit (PMU) employed in conventional semiconductor testing apparatus (for instance, a semiconductor characteristic measuring apparatus such as an HP4145 manufactured by the Hewlett Packard Company). The unit is capable of performing both voltage setting/current measuring operations and current setting/voltage measuring operations, the architecture of which is widely used in IC tester and DC characteristic evaluation apparatus marketed by the Applicant's Assignee.

In FIG. 6, an error amplifier 111 is connected via an integrator 112 and a buffer 113 to one terminal "a" of a current measuring resistor 120. Signal generating source 110 comprises error amplifier 111, integrator 112, and buffer 113.

The other terminal "b" of current measuring resistor 120 is connected to a predetermined terminal of a DUT. Both ends of resistor 120 are connected via buffers 131a and 131b, respectively, to input terminals of a differential amplifier 132. An output terminal of differential amplifier 132 and an output terminal of buffer 131b are connected to error amplifier 111.

It should be noted that the buffers 131a, 131b and differential amplifier 132 constitute a current measuring circuit, whereas the buffer 131b constitutes a voltage measuring circuit. When voltage setting/current measuring operations are performed, a setting voltage ($V_{FIN}$) is applied as an analog voltage to error amplifier 111 from a measuring signal process circuit (not shown) via a digital to analog converter (DAC) (not shown). Error amplifier 111 receives a voltage $V_{MOUT}$ appearing at terminal "b" of current measuring resistor 120, compares voltage $V_{FIN}$ with voltage $V_{MOUT}$ appearing at the terminal "b", and outputs an error signal to the integrator 112 in order that $V_{MOUT}$ becomes equal to $V_{FIN}$.

A current (namely, a current supplied to a DUT) flowing through the current measuring resistor 120 may be detected by measuring a voltage across ends "a" and "b" of resistor 120. The voltage across ends "a" and "b" is provided as an output voltage from differential amplifier 132 and is then supplied via an ADC (not shown) to the above-described measurement signal processing circuit.

When current setting/voltage measuring operations are executed, a setting current signal ($I_{FIN}$) is supplied from the above-mentioned measurement signal processing circuit via a DAC to error amplifier 111. Error amplifier 111 is fed the voltages appearing across both ends of resistor 120, and outputs an error signal to integrator 112 in order that a current (namely, the current supplied to a DUT) flowing through resistor 120 becomes equal to the setting current. A voltage applied to the DUT is detected by measuring a voltage at terminal "b" of resistor 120. This voltage is furnished via buffer 131b and an ADC to a measurement signal processing circuit (not shown).

However, since stabilities of the voltage and current feedback loops are established with respect to predictable load conditions in the above-described circuit, the gain/frequency characteristic of the overall feedback loop is suppressed to a low value. As a consequence, a lengthy time period is required until the output signal $V_{OUT}$ converges, and therefore it is difficult to accomplish a high-speed measurement.

Even if a load causing no stability problem is employed, because the feedback loop is activated based on worst case conditions, measurement speed is limited.

In other words, when the gain/frequency characteristic of the overall loop is extended to a high frequency range to achieve a high-speed measurement, overshoots occur when voltage settings are changed. A ringing phenomenon thus occurs, depending upon load conditions. In a worst case, other problems such as oscillations may occur. Also, since capacitors must be connected to various circuit portions to maintain stability of the feedback loop, errors caused by dielectric absorption and capacitive leakage currents occur.

The present invention solves the above-described problems, and therefore has as an object to provide a voltage/current measuring unit and a voltage/current measuring method, which can measure various electric characteristics (such as a voltage/current characteristic of DUT) at high-speed and under stable conditions.

SUMMARY OF THE INVENTION

A measuring unit, according to the present invention, is constructed of:

a signal generating source having an error detecting unit;

a current measuring resistor provided between an output terminal of the signal generating source and a DUT connection terminal;

a voltage measuring circuit for measuring a voltage across the DUT connection terminal of said current measuring resistor; and a current measuring circuit for measuring a voltage across the terminals of said current measuring resistor, the signal measured by said voltage measuring circuit or said current measuring circuit being fed back to said signal generating source, characterized in that:

an ADC is provided in the voltage measuring circuit and the current measuring circuit. The ADC converts the voltage appearing at the DUT end of said current measuring resistor and the voltage appearing across the both terminals of the current measuring resistor. The error detecting unit of the signal generating source is digital, and also a DAC is employed as an output stage of said signal generating source.

Also, a measuring method is employed, wherein a signal from a signal generating source having an error detecting unit is inputted to one end of a current measuring resistor whose the other end is connected to a DUT;

a voltage across terminals of the DUT of a said current measuring resistor is measured by a voltage measuring circuit;

a voltage across both terminals of said DUT is measured by a current measuring circuit; and the signal measured by either said voltage measuring circuit or said current measuring circuit is fed back to said signal generating source, and said feedback signal is compared with either a current setting value or a voltage setting value, whereby the voltage appearing across the DUT side of said current measuring resistor is made equal to the current setting value, or the voltage appearing across both ends of the current measuring resistor is made equal to the current setting value.

The measuring method is characterized in that both the voltage appearing at the DUT terminal of said current measuring resistor and the voltage across the terminals of said current measuring resistor are converted into digital values in the voltage measuring circuit and the current measuring circuit, and digital error detection occurs between the signal fed back to said signal generating source and either the setting voltage, or the setting current.

In the signal generating source according to the present invention, the error detecting unit is constructed as a digital circuit. For instance, an error between the feedback signal and either the setting voltage, or the setting current is digitally calculated to obtain a digital error signal; the digital error signal is D/A-converted into an analog error signal; the analog error signal is inputted into the integrator; and an output of the integrator is applied to the current measuring resistor. It is of course possible to construct the signal generating source without providing an integrator at the output of the error detecting unit. In such case, the function (namely, an integral of error values) provided by the integrator may be achieved by a digital signal processor (DSP).

Further, normally, one pair of ADCs are employed for converting the analog voltage across both ends of the current measuring resistor into digital values. A digital subtractor calculates a difference between the outputs derived from both ADCs. After a difference between the analog voltages across both ends of the current measuring resistor has been obtained in analog form, the analog difference value may be A/D-converted into a corresponding digital difference value. In such case, the above described subtractor may be omitted.

In the present invention, the analog signal derived from the DAC at the output of the signal generating source, is supplied via the current measuring resistor to a DUT.

In case of voltage setting/current measuring operations, the analog voltage appearing across the terminals of the current measuring resistor at the DUT side is A/D-converted into a digital voltage which is then fed back to the signal generating source. The error detecting unit of the signal generating source comprises digital circuits that compare the setting voltage with the digital voltage signal to change the digital data value to be supplied to the DAC in such a manner that the voltage appearing at the terminals of the current measurement resistor at the DUT side becomes equal to the setting voltage.

In case of current setting/voltage measuring operations, voltages across both ends of the current measuring resistor are A/D-converted into digital voltage signals, respectively. Normally, after a difference between both of the digital signals has been digitally calculated, the digitally calculated difference is fed back to the signal generating source as the digital current signal. The error detecting unit of the signal generating source compares the setting current with the fed back digital current signal and changes the digital data value supplied to the DAC in such a manner that the current supplied to the current measuring resistor becomes equal to the setting current.

It should be noted that the voltage measuring circuit A/D-converts the voltage appearing at the DUT terminal of the current measuring resistor, thereby measuring the current to be supplied to the DUT.

The present invention is preferably operated so that measurements are repeatedly performed.

For instance, when a measurement is carried out under the same or similar conditions to a previous condition (same type of DUT, measurement, environment etc.), the voltage setting value of DAC during the previous measurement is stored in an external storage device and the control operation is performed by employing this setting value as a starting point. As a result, the voltage can be set faster than in a semiconductor measurement where 0 V is used as the starting point.

Further, even when no measurement under the same conditions has been performed, if the setting value of the DAC enables application of a desired output voltage as a starting point, then a high-speed measurement can be achieved that is several times faster than the measurement where 0 V is used as the starting point.

Furthermore, in case of no repetitive measurement, when the approximate value of a DUT is already known, the setting of DAC may be performed where the optimum voltage setting value is used as the starting point.

In addition, according to the present invention, an output voltage value control in accordance with load conditions may be performed. For instance, in the conventional unit shown in FIG. 6, it is difficult to obtain a stable output voltage in case of a capacitive load and an inductive load. In contrast, a stable output voltage can be set to a desired condition by varying a digital signal value without changing the circuit design and the hardware.

Conventionally, when a voltage higher than the rating voltage of a DUT is applied to the DUT, there are some risks that the DUT will be destroyed. As a consequence, since stability under a worst load condition is maintained, there are some cases that the speed of measurement is sacrificed.

In the present invention, since setting of the output voltage in the signal generating source is performed by a digital circuit which allows, the output voltage to be quickly moved to a desired voltage, the above-described problems are solved.

DESCRIPTION OF SYMBOLS

1 - - - signal generating source,

11 - - - DSP,

12 - - - DAC,

13 - - - buffer,

2 - - - current measuring resistor,

3 - - - current measuring circuit, 31a, 31b - - - buffer,
32a, 32b - - - ADC,
33 - - - digital subtracter,
4 - - - voltage measuring circuit.

DETAILED DESCRIPTION OF THE INVENTION

Figure 1:
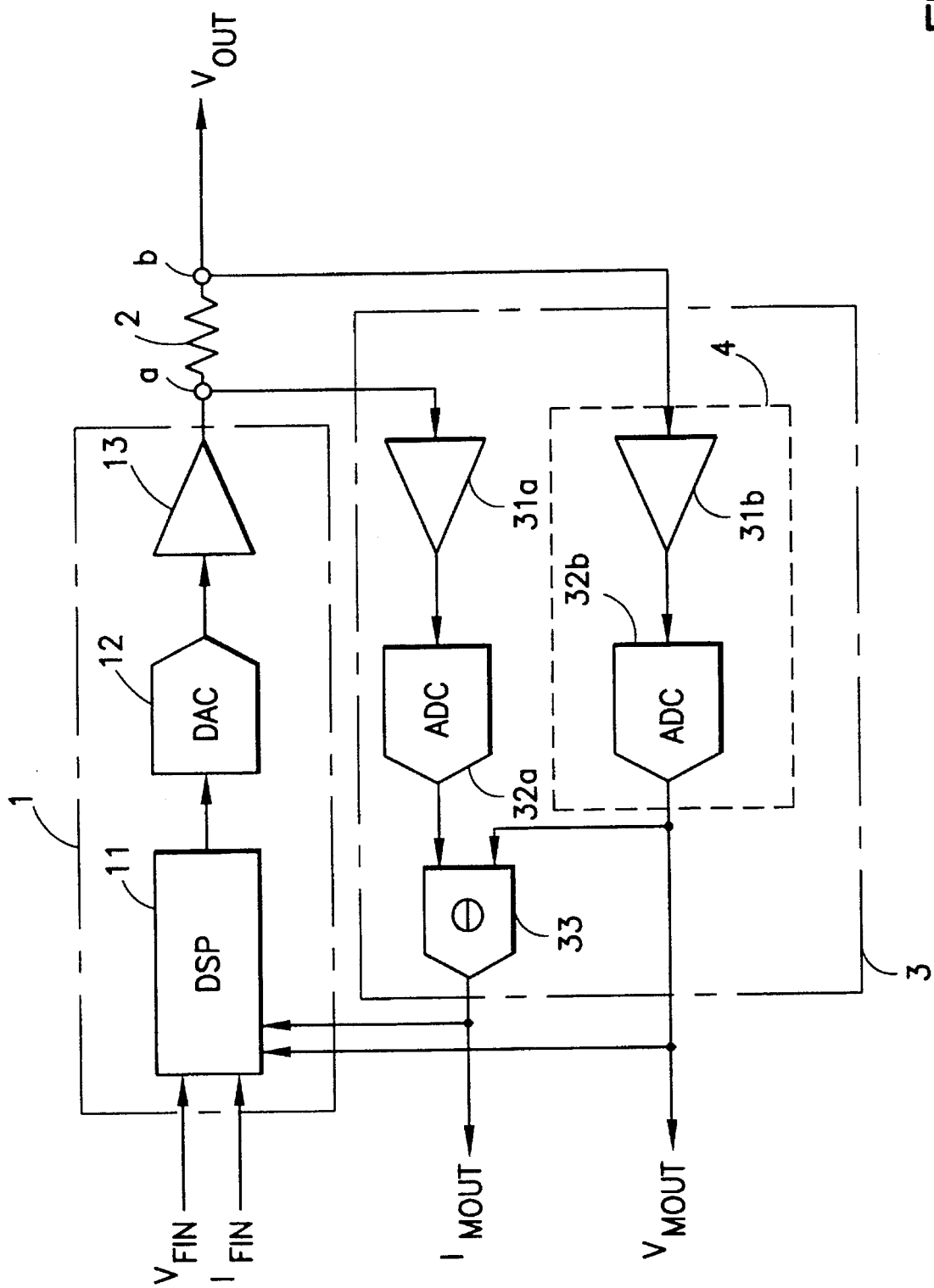
FIG. 1 is a block diagram showing a voltage/current measuring unit according to an embodiment of the present invention.

FIG. 1 is a circuit diagram of a measuring unit according to one embodiment of the present invention. A signal generating source 1 includes a digital signal processor (DSP) 11, DAC 12 and a buffer 13. DSP 11 includes an error detecting unit, into which a voltage setting value $V_{FIN}$ is supplied in the form of a digital signal. Also digital signals are inputted from ADC 32b and a digital subtracter 33 (to be discussed below).

A buffer 13 is connected to one terminal "a" of a current measuring resistor 2, and another terminal "b" of current measuring resistor 2 is to a DUT.

Terminals "a" and "b" of resistor 2 are respectively connected via buffers 31a and 31b to ADC 32a and 32b. Output terminals of both ADCs 32a and 32b are connected to input terminals of a digital subtracter 33.

As previously explained, output terminals of ADC 32b and subtracter 33 are connected to DSP 11. It should be noted that outputs of ADC 32b and the subtracter 33 are transferred as a voltage measurement value $V_{MOUT}$ and a current measurement value $I_{MOUT}$, respectively, to a measurement signal processing circuit (i.e., a microprocessor, memory, etc., not shown).

Buffers 31a, 31b, ADC's 32a, 32b and subtracter 33 constitute a current measuring circuit 3. Also, buffer 31b and ADC 32b constitute a voltage measuring circuit 4.

In the case of voltage setting/current measuring operations, an analog voltage appearing at terminal "b" of current measuring resistor 2 is inputted to ADC 32b via buffer 31b. In ADC 32b, the analog voltage is converted into a digital signal $V_{MOUT}$. The digital signal is supplied to a measurement signal processing circuit (not shown) and also to DSP 11. In DSP 11, digital value $V_{MOUT}$ is compared with voltage setting value $V_{FIN}$. Both a difference value between the value $V_{MOUT}$ and voltage setting value $V_{FIN}$ and past historical data of the difference voltage are used to calculate an optimum setting value for DAC 12. In other words, a digital value is calculated that causes output voltage $V_{OUT}$ to be driven to equal voltage setting value $V_{FIN}$.

Current measuring circuit 3 measures a current supplied to the DUT, based on a voltage measured value $I_{MOUT}$ between both terminals of the current measuring resistor 2, and also the resistance value thereof.

In case of current setting/voltage measuring operations, an analog voltage value derived from both terminals "a" and "b" of current measuring resistor 2, is A/D-converted by ADCs 32a and 32b. The digital outputs from both ADCs 32a and 32b are inputted into subtracting circuit 33 to calculate a digital difference therebetween. Thereafter, the digital difference value is fed back to DSP 11 as a current signal $I_{mout}$.

DSP 11 compares the feedback current signal $I_{MOUT}$ with setting current $I_{FIN}$, and derives a digital value which is supplied to DAC 12 so that current supplied to the current measuring resistor 2 (namely, current supplied to the DUT) becomes equal to the setting current $I_{FIN}$. The voltage measuring circuit 4 measures the voltage applied to the DUT by deriving the voltage appearing at the DUT terminal "b" of current measuring resistor 2 and then by A/D-converting this voltage.

As a result, various characteristics of a DUT, such as a voltage/current characteristic, may be stably measured at high speed.

Figure 2:
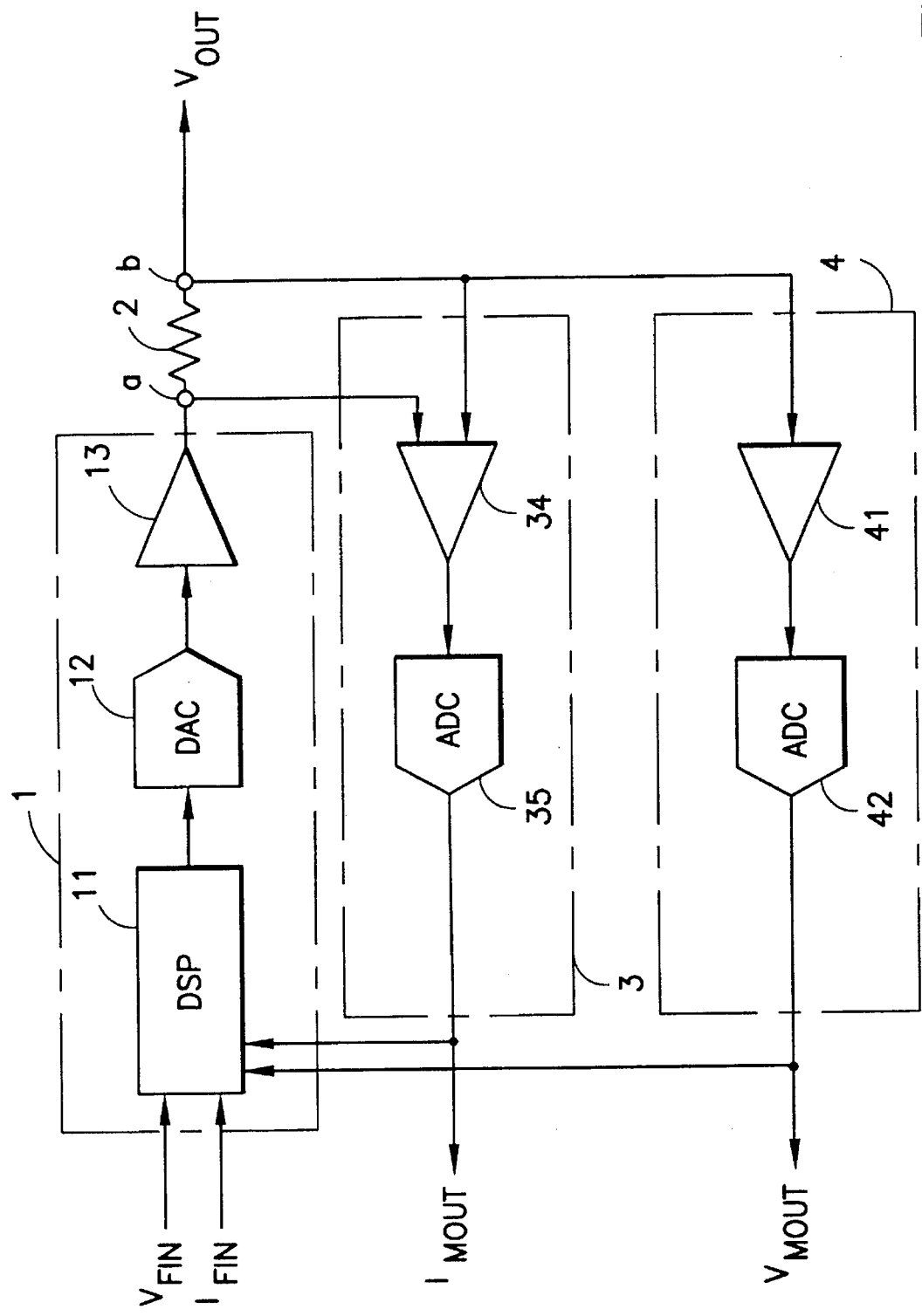
FIG. 2 is a block diagram representing a design modification of the measuring unit shown in FIG. 1.

FIG. 2 shows an example of a modification of the unit indicated in FIG. 1. In the unit of FIG. 2, a voltage across both terminals "a" and "b" of current measuring resister 2 is obtained as an analog value by a differential amplifier 34. Then, the analog voltage is A/D-converted by ADC 35 into a digital voltage which is then fed back to DSP 11 (in this case, buffer circuit 31a and subtracting circuit 33 are not needed).

In FIG. 2, current measuring circuit 3 includes differential amplifier 34 and ADC 35. The voltage measuring circuit 4 includes a buffer 41 and ADC 42 (corresponding to buffer 31a and ADC 32 of FIG. 1). Voltage measuring circuit 4 is used to measure a voltage appearing at terminal "b" of current measuring resistor 2. Different from the voltage measuring circuit of FIG. 1, voltage measuring circuit 4 is not so constructed to use a portion of current measuring circuit 3.

Because ADC 35 A/D-converts a differential voltage across terminals "a" and "b" of current measuring resistor 2, resolution is increased.

Since the above-described unit derives an analog difference value by way of differential amplifier 34, an analog error may occur. However, so long as this error is negligible, the unit shown of FIG. 2 is preferably utilized.

Figure 3:
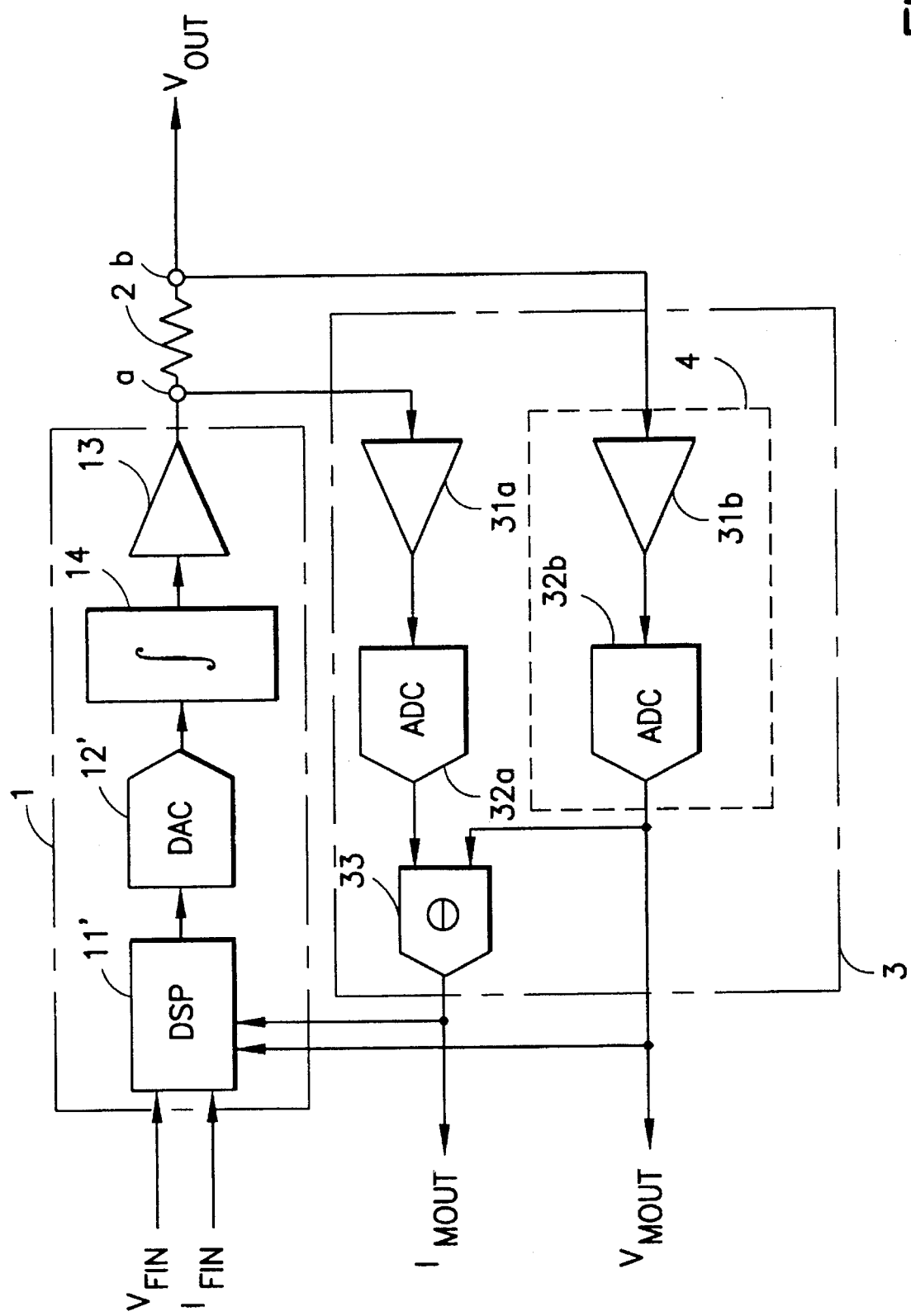
FIG. 3 is a block diagram indicating another design modification of the measuring unit shown in FIG. 1.

FIG. 3 indicates another example of a design modification of the unit shown in FIG. 1.

In the unit of FIG. 3, signal generating source 1 includes DSF 11', DAC 12', an integrator 14 provided at the output of DAC 12, and a buffer 13. DSP 11' detects an error between a setting signal and a feedback signal. An error component is converted by DAC 12' into an analog signal, and thereafter this analog signal is integrated by integrator 14.

In the arrangement of FIG. 3, the integrating process of the error component effected in DSP 11 in the unit of FIG. 1 is performed by an analog integrator 14. Since an integrator includes no minimum calculating unit (as in the DSP processing apparatus), resolution of the output voltage is not limited by resolution of DSP 11 and DAC 12, as in case of FIG. 1. As a result, the resolution of DAC 12' is reduced to the minimum 1 bit, thereby simplifying the hardware arrangement.

As previously stated, controls adapted to load conditions can be performed by the DSP.

Figure 4:
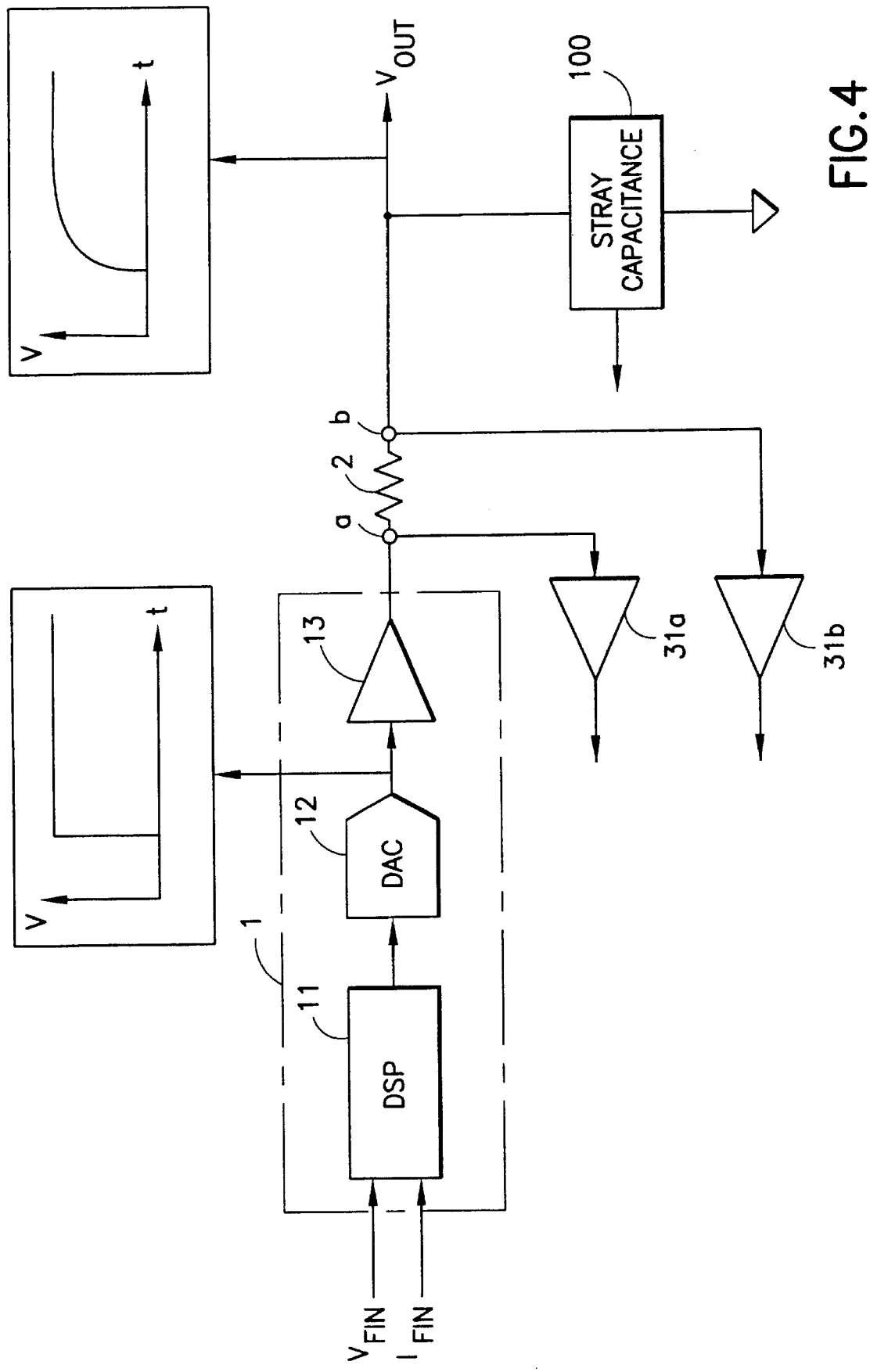
FIG. 4 is a partial circuit diagram representing a condition when a load characteristic of the measuring unit of FIG. 1 is measured.

FIG. 4 is a partial circuit diagram showing a load connected to the measured signal output terminal of the unit shown in FIG. 1, in order to measure the load characteristic of this unit.

In FIG. 4, a stepped waveform is inputted from DAC 12 via buffer 13 and current measuring resistor 2 to a DUT (not shown). The distorted waveform is shown at output terminal "b". It should be noted that stray capacitance of a fixture (measuring jig) is indicated by reference numeral 100.

Generally speaking, there are many possibilities in a measurement of a semiconductor that the DUT may be represented as a capacitive load. Also, even if a DUT per se does not exhibit a capacitive characteristic, there is capacitance from the measuring jig (see capacitance 100 of FIG. 4). This capacitance will constitute a time constant RC (symbol "R" denotes a resistance value of resistor 2, and symbol "C" represents the capacitance value 100). This time constant causes a lag in a rising edge of a waveform appearing at the measurement terminal (see in FIG. 5).

In FIG. 4, DSP circuit 11 provides no correction based on a difference between the voltage at terminal "b" and the setting voltage value, which is different from normal operation, however, a simple stepped voltage waveform is outputted.

Figure 5:
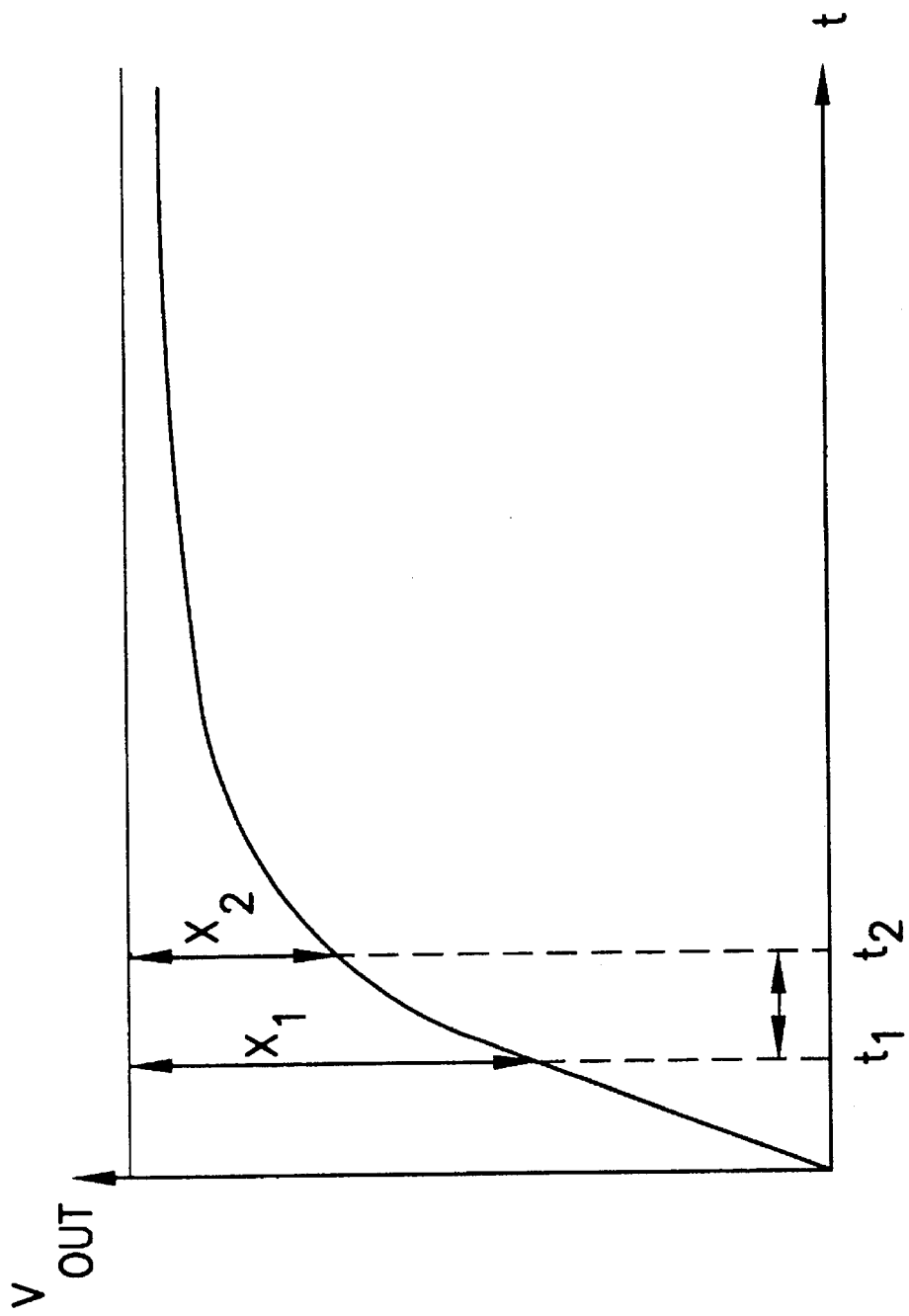
FIG. 5 is a graph indicative of an output response in the circuit of FIG. 4.

The voltage waveform at terminal "b" is shown in FIG. 5. This waveform is observed at the ADC (see ADC 32b of FIG. 3) that is provided at the output side of buffer 31b. The time constant "RC" is given as follows, assuming that differences between the fixed value and the voltage value at time instants $t_1$ and $t_2$ are $X_1$ and $X_2$, respectively;

$RC=(t_2-t_1)/(\log x_2 - \log x_1)$, where the symbol "log" indicates a natural logarithm.

It should be noted that since the resistance value "R" is known, the capacitance value "C" may be determined from this value "R".

In accordance with this measurement, either the integrating time constant "T" for the DSP digital feedback process, or the stable condition of the gain 1/T may be obtained under such conditions that T>RC, or 1/T<1/RC.

If the actual digital feedback gain is set with a proper allowance within the range for satisfying this condition, then a high-speed setting operation can be stably achieved.

Furthermore, in measuring units according to the present invention (especially, as shown in FIG. 1 and FIG. 2), no analog integrator is contained in the signal generating circuit), an arbitrary numeral series is given to the DAC for driving the output buffer, so that this DAC may be used as an arbitrary waveform generator (AWG).

Figure 6:
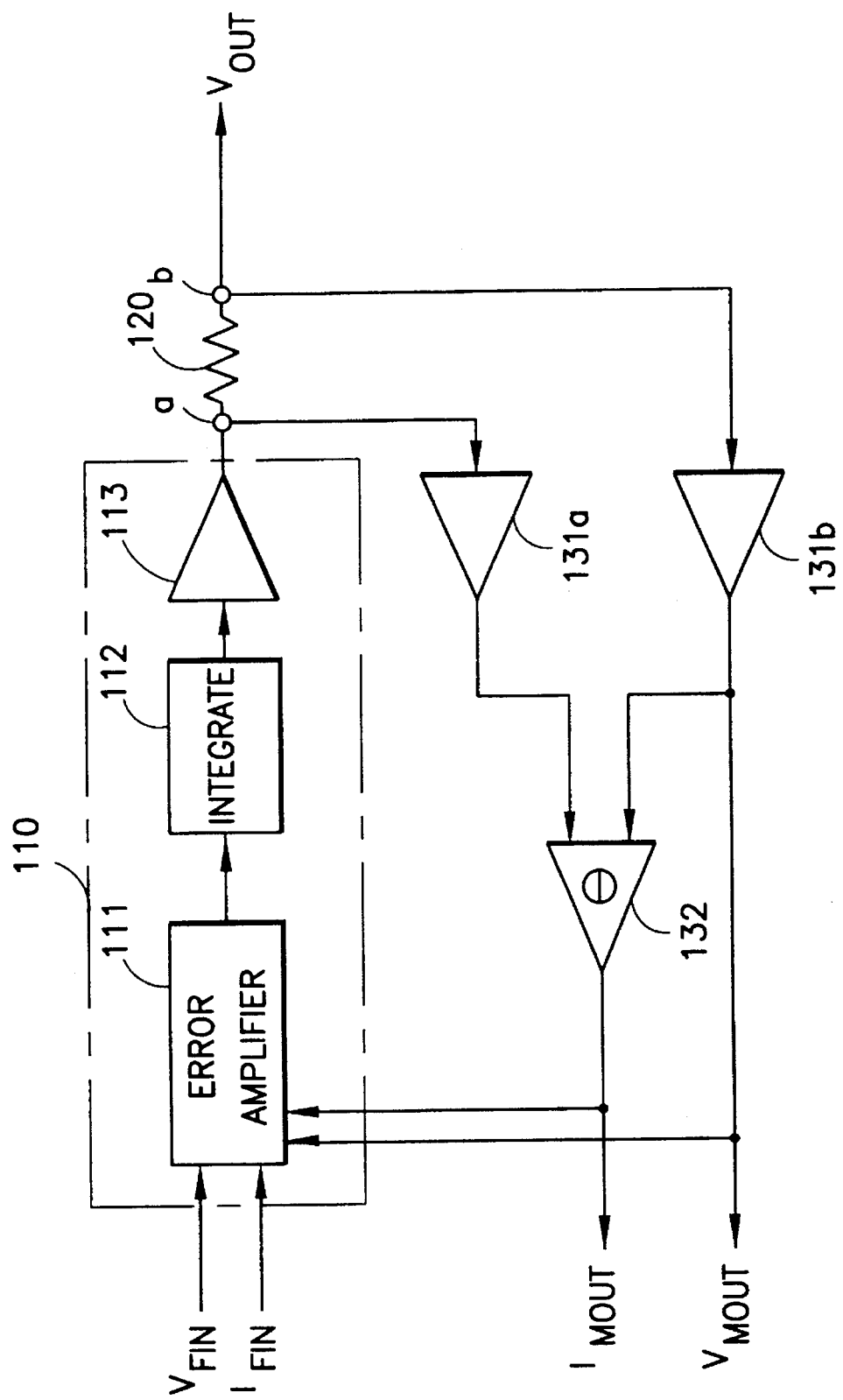
FIG. 6 is a circuit diagram for showing the conventional voltage/current measuring unit.

It should be noted that in a conventional measuring unit such as shown in FIG. 6, since there is provided an integrator between the $V_{FIN}$ and the output, the DAC cannot directly drive the measuring terminal of a DUT (as an arbitrary waveform generator) with a sufficient speed.

In semiconductor measurements, it is important to measure an applied biasing voltage and a capacitance when a DC bias is applied to the semiconductor. Measurements of the DC bias voltage and the capacitance of DUT are referred to as a "C-V measurement".

A relationship between C and V (i.e., C-V characteristic) may be obtained, without separately providing hardware for measuring capacitance, by utilizing the present invention. That is to say, the measuring unit is used as an arbitrary waveform generator without employing digital feedback. A sine wave superimposed with a DC voltage is produced by this arbitrary wave generator, and the measurements of voltage and current for a DUT are performed by the ADC in synchronism with the generated sine wave.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A voltage/current measuring unit comprising:

a signal generating source including a digital signal processor having a digital error detecting unit, and a digital-to-analog converter (DAC), connected in series, said digital error detecting unit providing a digital error voltage to said DAC that is a difference between settable input digital voltage and feedback digital signal values;

a current measuring resistor having first and second terminals respectively connected to an output terminal of the signal generating source and a connection terminal;

a voltage measuring circuit connected to said digital error detecting unit for measuring a voltage at said second terminal of said current measuring resistor and for providing a voltage feedback signal to said signal generating source; and a current measuring circuit connected to said digital error detecting unit for measuring a voltage across said first and second terminals of said current measuring resistor, and for providing a current feedback signal to said signal generating source;

said voltage measuring circuit and current measuring circuit both including analog-to-digital converter means for respectively concerning a voltage appearing at said second terminal of said current measuring resistor and a voltage appearing across said first and second terminals of said current measuring resistor int digital feedback voltage values that are fed to said signal generating source as said feedback digital signal values.

2. The voltage/current measuring circuit as recited in claim 1 wherein said digital error detecting unit outputs an initial digital error voltage value dependent upon a pre-established parameter derived from a past output voltage.

3. The voltage/current measuring circuit as recited if claim 1 wherein said digital error detecting unit outputs an initial digital error current value dependent upon a pre-established parameter derived from a past output current value.

4. The voltage/current measuring circuit as recited in claim 1 wherein said voltage measuring circuit comprises a buffer amplifier and an analog to digital converter (ADC) and said current measuring circuit comprises said voltage measuring circuit and a series connected buffer amplifier, ADC and a digital subtractor, said digital subtractor also fed by an output from said ADC in said voltage measuring circuit and providing a digital difference output to said digital error detecting unit.

5. The voltage/circuit measuring circuit as recited in claim 4 wherein said signal generating source further includes intergrating means coupled between anoutput from said DAC and said first terminal.

6. The voltage/current measuring circuit as recited in claim 1 wherein said voltage measuring circuit comprises a buffer amplifier and a series connected analog-to-digital converter (ADC), and said current measuring circuit comprises a buffer amplifier and a series connected buffer amplifier and ADC, outputs from said ADC's connected to said digital error detecting unit.

7. A voltage/current measuring method wherein a signal from a signal generating source having an error detecting unit is inputted to a first terminal of a current measuring resistor, said current measuring resistor having a second terminal connected to an object to be measured, the method comprising the steps of;

measuring a voltage at said second terminal of said current measuring resistor by a voltage measuring circuit which provides a digital voltage measurement value;

measuring a voltage across said first and second terminals of said current measuring resistor by a current measuring circuit which provides a digital current measurement value;

feeding said digital voltage measurement value from said voltage measuring circuit, or said digital current measurement value from said current measuring circuit to said signal generating source; and comparing said digital current measurement value with either a digital current setting value, or a digital voltage setting value, as the case may be, to provide an output which causes a voltage appearing at said second terminal of said current measuring resistor to approach the current setting value, or the voltage appearing across the first and second terminals of the current measuring resistor to approach the digital voltage setting value.

* * * * *

UNITED STATES PATENT AND TRADEMARK OFFICE
CERTIFICATE OF CORRECTION

PATENT NO. : 5,579,236
DATED : November 26, 1996
INVENTOR(S) : Toshio Tamamura and Shinichi Tanida It is certified that error appears in the above-identified patent and that said Letters Patent is hereby corrected as shown below:

In claim 1 at Col. 7, line 65, after "between" insert --a--.

In claim 1 at Col. 8, line 17, delete "concerning" and insert --converting-- therefor.

In claim 1 at Col. 8, line 21, delete "int" and insert --into-- therefor.

IN claim 3 at Col. 8, line 29, delete "if" and insert --in-- therefor.

In claim 5 at Col. 8, line 45, delete "anoutput" and insert -- an output-- therefor.

Signed and Sealed this

Seventeenth Day of June, 1997

*Attest:*

BRUCE LEHMAN

*Attesting Officer*  Commissioner of Patents and Trademarks